(12) United States Patent
Komiyama et al.

(10) Patent No.: US 8,945,957 B2
(45) Date of Patent: Feb. 3, 2015

(54) METHOD OF MANUFACTURING LIQUID EJECTION HEAD

(71) Applicant: Canon Kabushiki Kaisha, Tokyo (JP)

(72) Inventors: Hiroto Komiyama, Tokyo (JP); Satoshi Ibe, Yokohama (JP); Jun Yamamuro, Yokohama (JP); Kouji Hasegawa, Kawasaki (JP); Shiro Sujaku, Kawasaki (JP); Yoshinori Tagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/863,569

(22) Filed: Apr. 16, 2013

(65) Prior Publication Data

US 2013/0288405 A1   Oct. 31, 2013

(30) Foreign Application Priority Data

Apr. 27, 2012   (JP) .................................. 2012-103159

(51) Int. Cl.
*H01L 49/00* (2006.01)
*B41J 2/16* (2006.01)

(52) U.S. Cl.
CPC .............. *H01L 49/00* (2013.01); *B41J 2/1603* (2013.01); *B41J 2/1628* (2013.01); *B41J 2/1631* (2013.01); *B41J 2/1634* (2013.01); *B41J 2/1639* (2013.01); *B41J 2/1645* (2013.01)
USPC .......................................................... 438/21

(58) Field of Classification Search
None
See application file for complete search history.

(56) References Cited

U.S. PATENT DOCUMENTS

| 4,392,907 | A | * | 7/1983 | Shirato et al. .................. 156/252 |
| 8,177,988 | B2 | | 5/2012 | Komiyama et al. |
| 2004/0259372 | A1 | | 12/2004 | Komuro et al. |
| 2007/0211115 | A1 | * | 9/2007 | Ibe et al. .......................... 347/58 |
| 2008/0227035 | A1 | | 9/2008 | Kanri et al. |
| 2010/0216264 | A1 | * | 8/2010 | Matsumoto et al. ............ 438/21 |
| 2010/0317130 | A1 | * | 12/2010 | Hayakawa ....................... 438/21 |

FOREIGN PATENT DOCUMENTS

| JP | 2007-160625 A | | 6/2007 |
| JP | 2009-061665 A | * | 3/2009 |

OTHER PUBLICATIONS

Office Action in Chinese Application No. 201310152570.8 (Sep. 2, 2014).

* cited by examiner

*Primary Examiner* — Charles Garber
*Assistant Examiner* — Alia Sabur
(74) *Attorney, Agent, or Firm* — Fitzpatrick, Cella, Harper & Scinto

(57) ABSTRACT

The method of manufacturing a liquid ejection head includes: forming a first protective layer on one surface of the substrate; forming the wiring layer on another surface of the substrate; forming the insulating layer on the wiring layer, and then partially removing the insulating layer to partially expose the wiring layer; forming the electrode pad on an exposed portion of the wiring layer; forming a flow path member on the another surface of the substrate; forming a second protective layer on the one surface of the substrate after the formation of the flow path member; and partially removing at least one of the first protective layer and the second protective layer, and then forming the supply port leading from the one surface of the substrate to the another surface of the substrate.

9 Claims, 4 Drawing Sheets

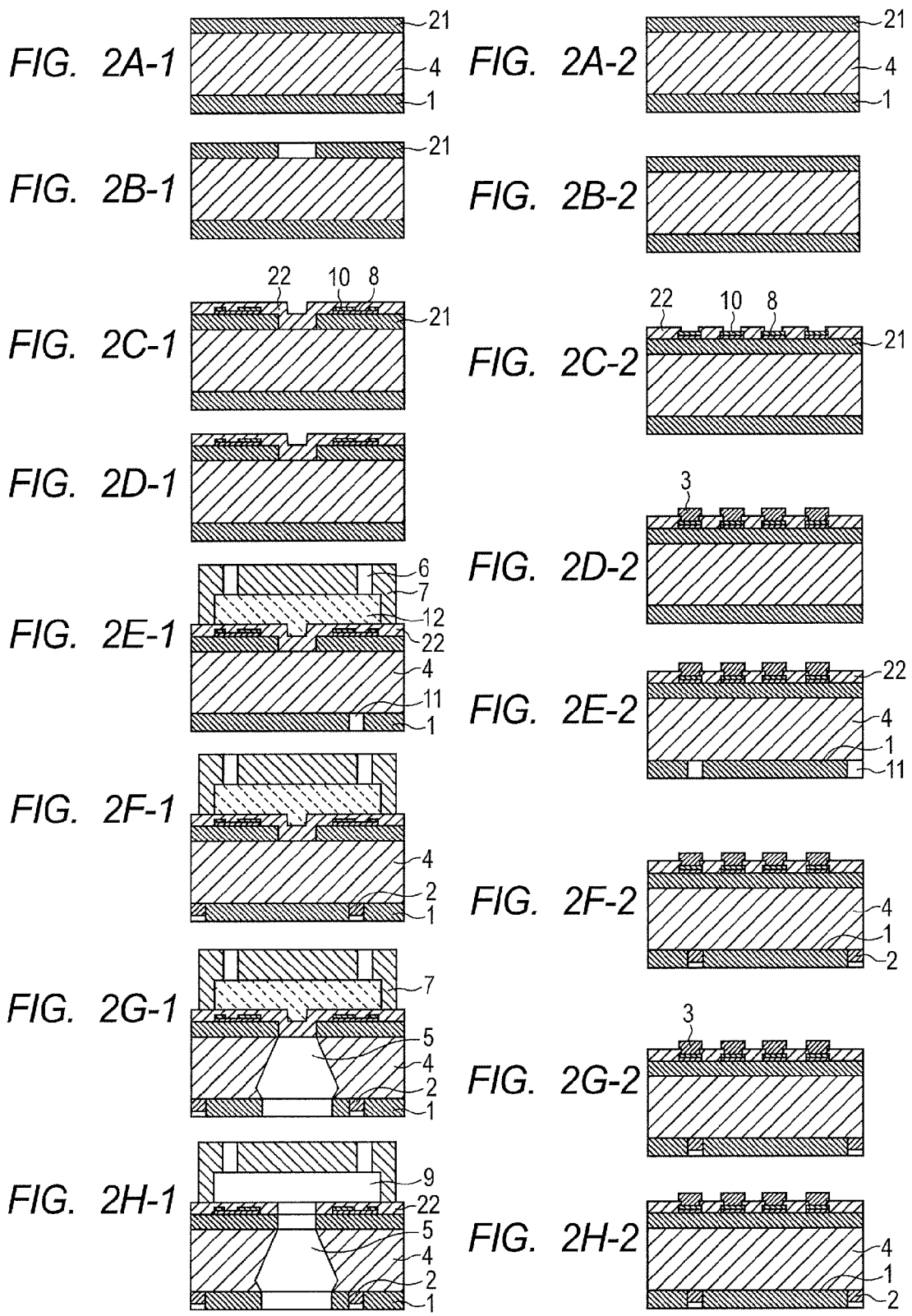

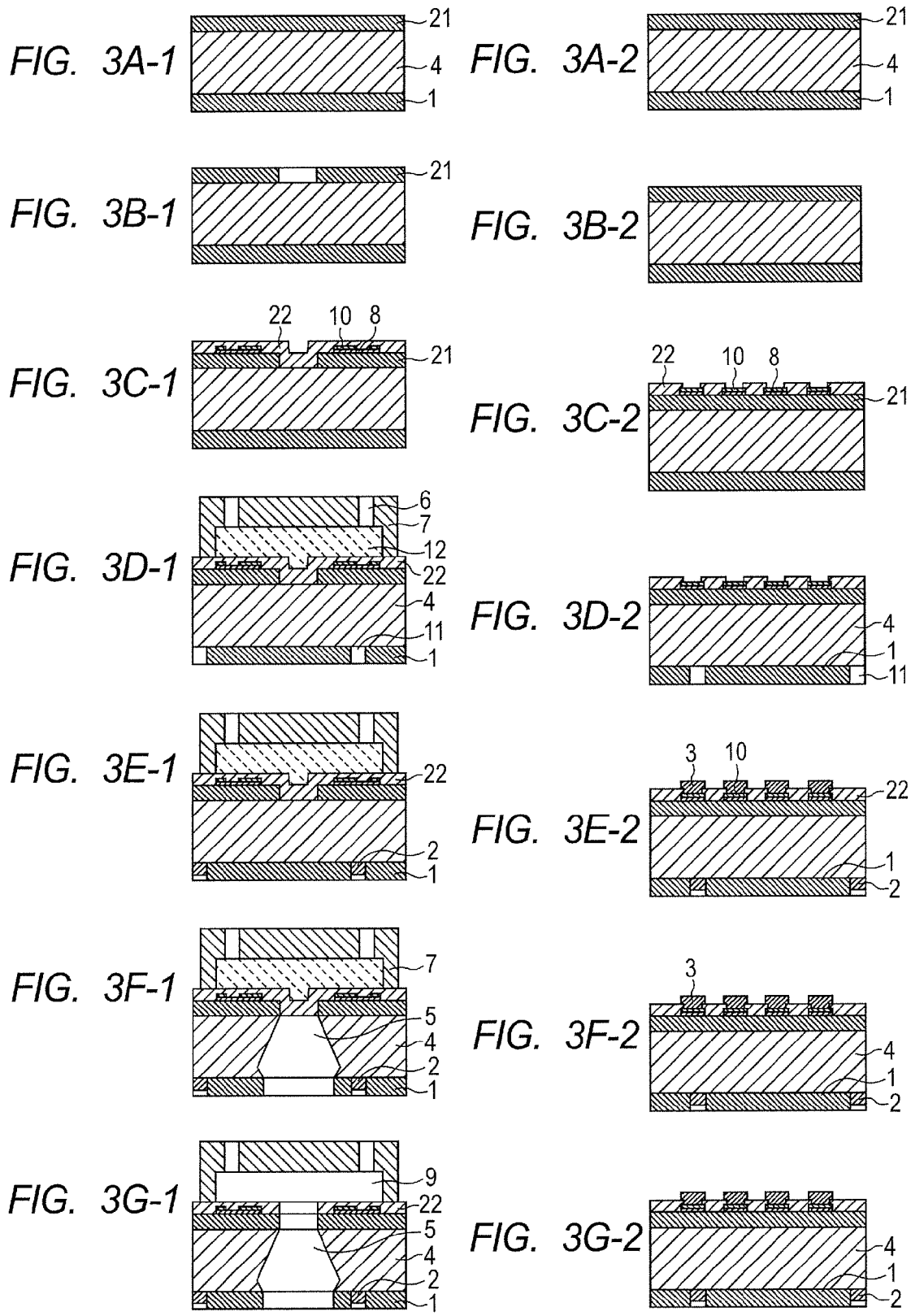

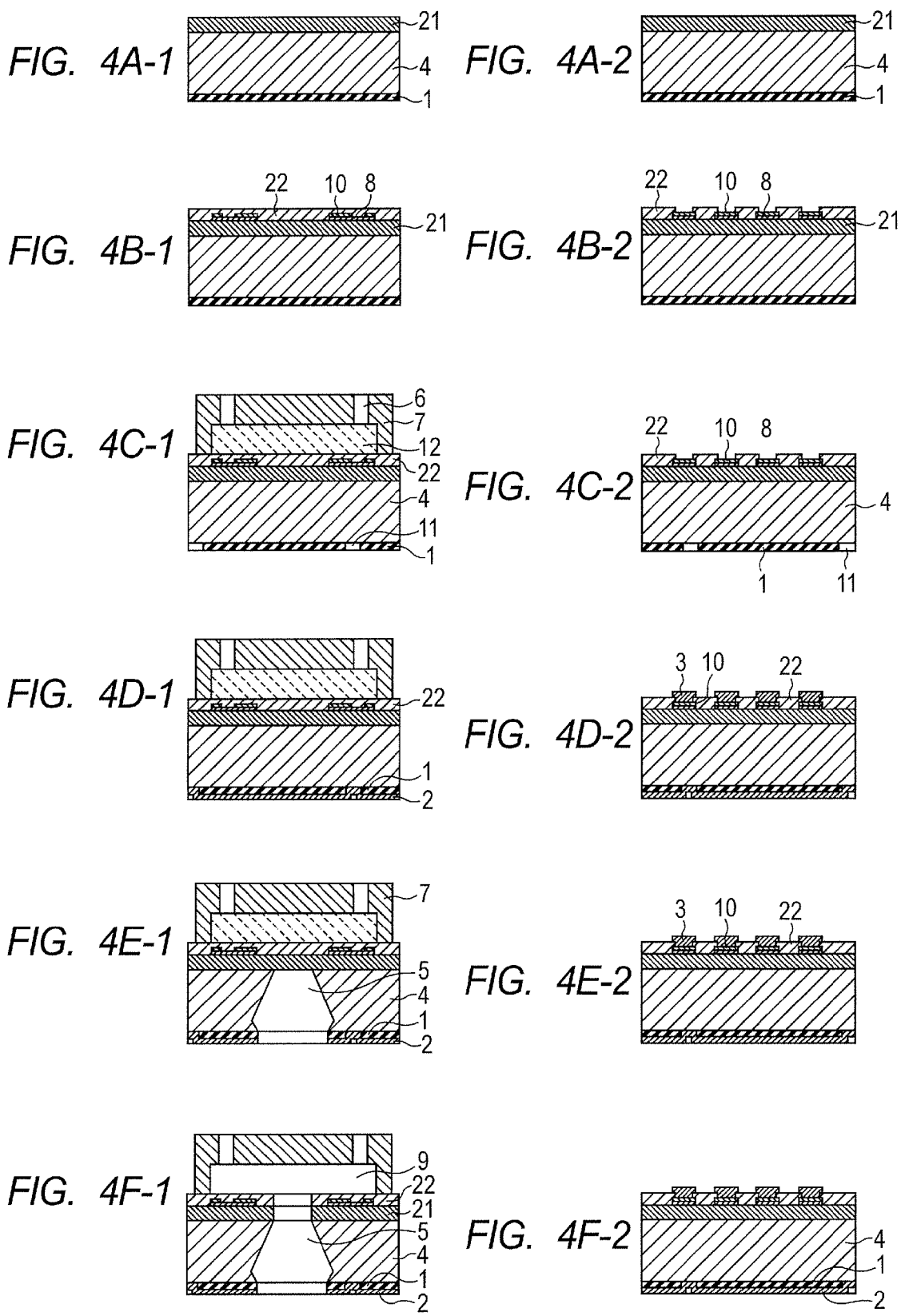

METHOD OF MANUFACTURING LIQUID EJECTION HEAD

BACKGROUND OF THE INVENTION

1. Field of the Invention

The present invention relates to a method of manufacturing a liquid ejection head.

2. Description of the Related Art

An ink jet printer ejecting an ink is widely known as a recording device which ejects liquid to perform a recording operation. A liquid ejection head used for the recording device includes a liquid-ejection-head substrate and a flow path member. The liquid-ejection-head substrate includes energy generating elements for generating energy to eject liquid. The flow path member forms ejection orifices and a part of a flow path for the liquid. The liquid-ejection-head substrate is provided with electrode pads for transmitting an electric signal from a member different from the liquid-ejection-head substrate to the liquid-ejection-head substrate. Moreover, a supply port for supplying the liquid to the energy generating elements is provided to the liquid-ejection-head substrate so as to pass through the liquid-ejection-head substrate.

As a method of manufacturing the liquid ejection head, for example, a method disclosed in Japanese Patent Application Laid-Open No. 2009-61665 is given. Specifically, in the method, a substrate provided with an alkali-resistant protective layer is prepared. After a flow path member is formed on the substrate, a laser pattern is created so as to pass through the protective layer and engrave the substrate by a given amount. Then, the substrate is etched with an alkaline liquid through the created laser pattern.

According to the method disclosed in Japanese Patent Application Laid-Open No. 2009-61665, a damage is caused in the alkali-resistant protective layer in the process from after the formation of the alkali-resistant protective layer to the completion of the formation of the flow path member. This may expose the substrate which lies under the alkali-resistant protective layer. If the supply port is formed in this state, the alkaline liquid passes through the damage in the alkali-resistant protective layer to disadvantageously etch the substrate. As a result, a processed shape of the supply port is enlarged or an unintended processed hole is formed in some cases. Therefore, the quality of the liquid ejection head is required to be further improved.

SUMMARY OF THE INVENTION

The present invention has been accomplished to solve the problem described above, and has an object to stabilize an etching processed shape in the formation of a supply port.

According to an aspect of the present invention, there is provided a method of manufacturing a liquid ejection head which includes a substrate; a protective layer formed on one surface of the substrate; a wiring layer formed on another surface of the substrate; an insulating layer and an electrode pad provided on the wiring layer; and a supply port provided so as to bring the one surface of the substrate and the another surface of the substrate into communication with each other, the method including (1) forming a first protective layer on the one surface of the substrate; (2) forming the wiring layer on the another surface of the substrate; (3) forming the insulating layer on the wiring layer, and then partially removing the insulating layer to partially expose the wiring layer; (4) forming the electrode pad on an exposed portion of the wiring layer; (5) forming a flow path member on the another surface of the substrate; (6) forming a second protective layer on the one surface of the substrate after the formation of the flow path member; and (7) partially removing at least one of the first protective layer and the second protective layer, and then forming the supply port leading from the one surface of the substrate to the another surface of the substrate.

Further features of the present invention will become apparent from the following description of exemplary embodiments with reference to the attached drawings.

BRIEF DESCRIPTION OF THE DRAWINGS

FIGS. 2A-1, 2A-2, 2B-1, 2B-2, 2C-1, 2C-2, 2D-1, 2D-2, 2E-1, 2E-2, 2F-1, 2F-2, 2G-1, 2G-2, 2H-1 and 2H-2 are sectional views illustrating a manufacturing process of a liquid ejection head according to a first embodiment of the present invention.

FIGS. 3A-1, 3A-2, 3B-1, 3B-2, 3C-1, 3C-2, 3D-1, 3D-2, 3E-1, 3E-2, 3F-1, 3F-2, 3G-1 and 3G-2 are sectional views illustrating a manufacturing process of a liquid ejection head according to a second embodiment of the present invention.

FIGS. 4A-1, 4A-2, 4B-1, 4B-2, 4C-1, 4C-2, 4D-1, 4D-2, 4E-1, 4E-2, 4F-1 and 4F-2 are sectional views illustrating a manufacturing process of a liquid ejection head according to a third embodiment of the present invention.

DESCRIPTION OF THE EMBODIMENTS

Figure 1A:
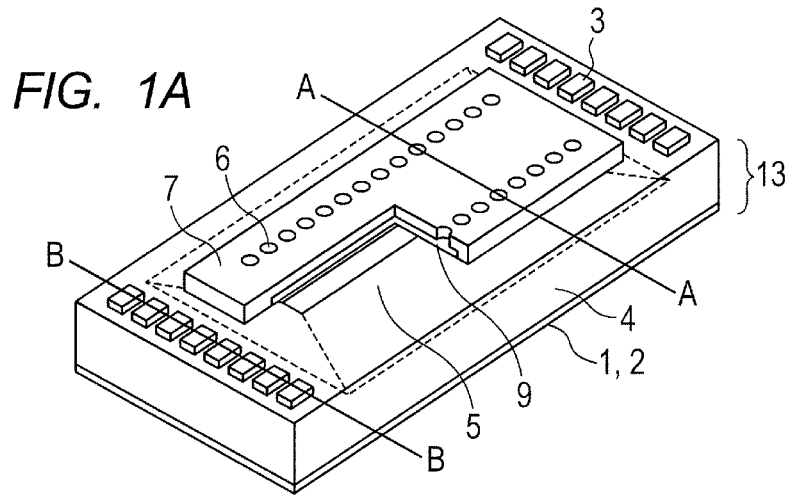
FIG. 1A is a perspective view.

In the following, embodiments of the present invention are described referring to the accompanying drawings.

The method of manufacturing a liquid ejection head according to the present invention is a method of manufacturing a liquid ejection head that includes a substrate; a protective layer formed on one surface of the substrate; a wiring layer formed on another surface of the substrate; an insulating layer and an electrode pad provided on the wiring layer; and a supply port provided so as to bring the one surface of the substrate and the another surface of the substrate into communication with each other, the method including (1) forming a first protective layer on the one surface of the substrate; (2) forming the wiring layer on the another surface of the substrate; (3) forming the insulating layer on the wiring layer, and then partially removing the insulating layer to partially expose the wiring layer; (4) forming the electrode pad on an exposed portion of the wiring layer; (5) forming a flow path member on the another surface of the substrate; (6) forming a second protective layer on the one surface of the substrate after the formation of the flow path member; and (7) partially removing at least one of the first protective layer and the second protective layer, and then forming the supply port leading from the one surface of the substrate to the another surface of the substrate.

According to the method of the present invention, when a damage is caused in the first protective layer to expose the substrate in the steps after the formation of the first protective layer to the completion of the formation of the flow path member, an exposed portion is covered with and protected by the second protective layer. As a result, the etching processed shape in the formation of the supply port can be stabilized, thereby providing the high-quality liquid ejection head. In the method according to the present invention, the order of the steps (1) to (7) is not particularly limited. The method according to the present invention only needs to include at least the steps (1) to (7).

A liquid ejection head manufactured by the method according to the present invention may be mounted on such apparatus as a printer, a copying machine, a facsimile having a communication system, and a word processor having a printer portion, and further, on a recording apparatus for industrial use which is combined with various kinds of processing apparatus. By using the liquid ejection head manufactured by the method according to the present invention, recording may be performed on various kinds of recording media such as paper, thread, fabric, cloth, leather, metal, plastic, glass, lumber, and ceramic.

Note that, the term "recording" as employed herein means not only applying an image having meaning such as text or graphics onto a recording medium but also applying an image having no meaning such as a pattern. The term "liquid" as employed herein should be read broadly and denotes liquid which is applied onto a recording medium to form an image, a motif, a pattern, or the like or to process the recording medium, or for a treatment of an ink or the recording medium. The treatment of the ink or the recording medium means, for example, improvement of fixability by coagulation or insolubilization of a color material contained in the ink applied onto the recording medium, improvement of recording quality or a chromogenic property, improvement of image durability, and the like.

Figure 1B:
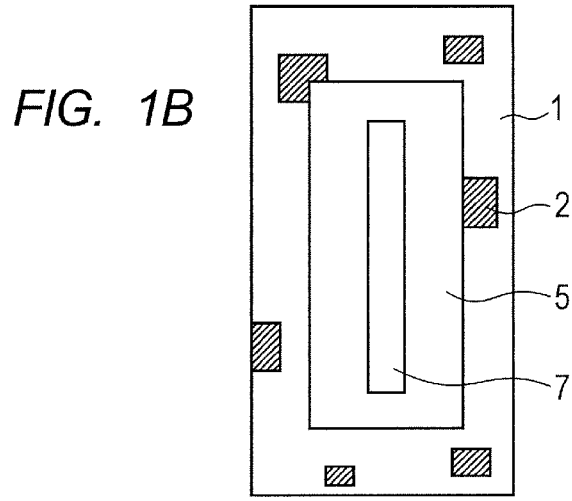
FIG. 1B is a plan view.
Figures 1, 1C:
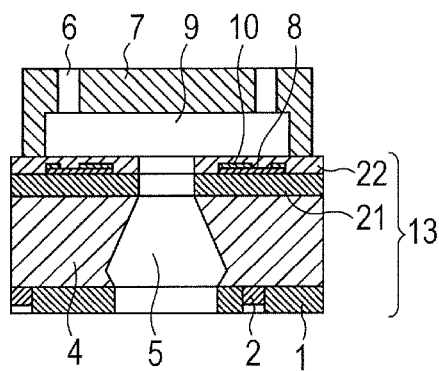
FIGS. 1C-1 and 1C-2 are sectional views, each illustrating an example of a liquid ejection head manufactured by a method according to the present invention.
Figures 1, 1C, 2:
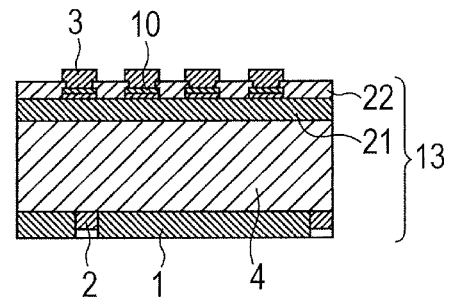

FIG. 1A is a perspective view illustrating an example of a liquid ejection head manufactured by a method according to the present invention. FIG. 1B is a plan view illustrating the liquid ejection head illustrated in FIG. 1A as viewed from below. FIG. 1C-1 is a sectional view of the liquid ejection head illustrated in FIG. 1A, taken along the line A-A. FIG. 1C-2 is a sectional view of the liquid ejection head illustrated in FIG. 1A, taken along the line B-B.

The liquid ejection head illustrated in FIGS. 1A to 1C-2 includes a liquid-ejection-head substrate 13 and a flow path member 7 provided on the liquid-ejection-head substrate 13. The liquid-ejection-head substrate 13 includes energy generating elements 8. The flow path member 7 includes ejection orifices 6 which use energy generated by the energy generating elements 8 to eject liquid. A flow path 9, which is in communication with the ejection orifices 6 and a supply port 5, is provided in a clearance between the flow path member 7 and the liquid-ejection-head substrate 13. Further, the liquid-ejection-head substrate 13 includes the supply port 5 for supplying the liquid to the flow path 9, which is formed through a substrate 4 made of silicon, and electrode pads 3 for electrical connection to the exterior. A support substrate of a liquid ejection unit (not shown), which is made of alumina or the like, is connected to a surface of the liquid-ejection-head substrate 13 on the side opposite to the side where the flow path member 7 is provided. Liquid supplied from the support substrate of the liquid ejection unit through the supply port 5 is transported to the flow path 9 and film-boiled by thermal energy generated by the energy generating elements 8 to be ejected from the ejection orifices 6. In this manner, a recording operation is performed.

Wiring layers 10, which are connected to drive the energy generating elements 8, are provided on the liquid-ejection-head substrate 13. An insulating layer 21 containing silicon oxide is provided below the energy generating elements 8 and the wiring layers 10. Further, an insulating layer 22 containing silicon nitride is provided on the energy generating elements 8 and the wiring layers 10. In the present invention, the number of the insulating layers 21 and 22 may be at least two.

On the surface of the liquid-ejection-head substrate 13, which is opposite to the side where the flow path member 7 is provided, a void portion of the supply port 5, a first protective layer 1, and a second protective layer 2 are provided, as illustrated in FIGS. 1B, 1C-1, and 1C-2.

First Embodiment

In the following, a method of manufacturing a liquid ejection head according to a first embodiment of the present invention is described referring to FIGS. 2A-1 to 2H-2. FIGS. 2A-1 to 2H-2 are sectional views of the liquid ejection head illustrated in FIG. 1A, taken along the line A-A and the line B-B, and illustrate respective steps. FIGS. 2A-1, 2B-1 and so forth are sectional views taken along the line A-A, whereas FIGS. 2A-2, 2B-2 and so forth are sectional views taken along the line B-B.

First, as illustrated in FIGS. 2A-1 and 2A-2, the substrate 4 having silicon (100) surfaces is prepared. The first protective layer 1 is formed on one of the (100) surfaces, whereas the insulating layer 21 is formed on another of the (100) surfaces of the substrate 4. As the insulating layer 21, a silicon oxide film formed by thermal oxidation or chemical vapor deposition can be used. As the first protective layer 1, a silicon oxide film having resistance to an alkaline etchant, which is formed by oxidation, can be used so as to act as a protective layer when the substrate 4 is wet-etched with the alkaline etchant in a later step. In this embodiment, the silicon oxide film is used as the first protective layer 1. As the first protective layer 1, at least one insulating layer or metal layer formed by vacuum deposition can be used. The insulating layer is, for example, a layer containing silicon oxide, silicon nitride, or silicon carbide. The metal layer is, for example, a layer containing nickel, gold, or copper. As a material of the first protective layer 1, there may be used, for example, silicon oxide, silicon nitride, silicon carbide, nickel, gold, and copper. The above-mentioned materials may be used solely or at least two thereof may be used in combination.

Next, as illustrated in FIGS. 2B-1 and 2B-2, a structure in which the insulating layer 21 is partially removed is formed. First, a positive resist containing an organic resin is applied onto the insulating layer 21 by spin coating. Exposure and development are carried out so as to partially remove the resist present in an exposed portion. Thereafter, the insulating layer 21 is selectively removed by dry etching to form the structure described above.

Next, as illustrated in FIGS. 2C-1 and 2C-2, a laminate structure including the energy generating elements 8, the wiring layers 10, and the insulating layer 22 is formed on the insulating layer 21. First, a tantalum-silicon alloy target is prepared and a tantalum silicon nitride film, which is used to form the energy generating elements 8, is formed by sputtering on the uppermost layer containing the insulating layer 21. Subsequently, an aluminum target is prepared and an aluminum film, which is used to form the wiring layers 10, is successively formed on the tantalum silicon nitride film by sputtering. Next, after a positive resist made of the organic resin is applied thereon by spin coating, exposure and development are carried out to partially remove the resist present in an exposed portion. Thereafter, the tantalum silicon nitride film and the aluminum film are selectively etched by dry etching. Thereafter, the resist is removed. In this manner, the energy generating elements 8 and the wiring layers 10 are formed. Next, the insulating layer 22 mainly formed of silicon nitride is formed by chemical vapor deposition on the energy generating elements 8 and the wiring layers 10. Further, after a positive resist made of the organic resin is applied onto the insulating layer 22 by spin coating, exposure and development are carried out to partially remove the resist present in the exposed portion. Thereafter, the insulating layer 22 is selectively removed by dry etching. In this manner, as illustrated in FIG. 2C-2, there is provided a structure in which the insulating layer 22 is partially removed to partially expose the wiring layers 10. In the present invention, a cavitation-resistant layer may be further provided in a portion where a flow path is to be formed, in the following manner. Specifically, a metal layer containing tantalum is further formed on the insulating layer 22. The metal layer is selectively removed by photolithography and etching to form the cavitation-resistant layer.

Next, as illustrated in FIGS. 2D-1 and 2D-2, the electrode pads 3 are formed on the exposed portions of the wiring layers 10. Electroplating can be used as a method of forming the electrode pads 3. First, a titanium-tungsten layer and a gold layer are formed by sputtering. A positive resist made of the organic resin is applied thereon by spin coating. After the resist is selectively removed by using photolithography to expose the gold layer, an electroplating treatment is performed in a plating solution containing gold. Thereafter, by removing the resist, the gold layer, and the titanium-tungsten layer, the electrode pads 3 can be formed. Note that, in the present invention, besides the electroplating method, electroless plating or vacuum deposition can be used as the method of forming the electrode pads 3. Moreover, besides gold, nickel or copper can be used as the material of the electrode pads 3. The above-mentioned materials may be used solely or at least two thereof may be used in combination.

Next, as illustrated in FIGS. 2E-1 and 2E-2, a laminate structure including a mold 12 and the flow path member 7 is formed on the uppermost layer containing the insulating layer 22, on another surface of the substrate 4. First, a positive photosensitive resin material, which is soluble in a solvent, is applied thereon by spin coating. Exposure and development are carried out to form the mold 12. The thickness of the mold 12 can be set to, for example, 5 to 30 μm. As the positive photosensitive resin material, it is preferred to use a material which is little compatible with a negative photosensitive resin material to be applied in a later step and can be easily removed in a step subsequent thereto. As the positive photosensitive resin material, for example, a thermoplastic resin can be used. Next, the negative photosensitive resin material is applied thereon by spin coating. Then, exposure and development are carried out to form the flow path member 7. The thickness of the flow path member 7 can be set to, for example, 10 to 80 μm on the mold 12. The negative photosensitive resin material is required to have not only small compatibility with the positive photosensitive resin material which is the material of the mold 12, but also anti-corrosiveness to an ink, adhesion to the substrate 4, strength against an external shock, and high patterning precision. As the negative photosensitive resin material, for example, a thermoplastic resin such as an epoxy resin (as a commercially available product, EHPE-3150 (trade name) manufactured by DAICEL Corporation), a polyether amide resin, a polyimide resin, a polycarbonate resin, and a polyester resin can be used. The above-mentioned thermoplastic resins may be used solely or at least two thereof may be used in combination. Subsequently, the flow path member 7 is subjected to exposure and development by using photolithography to form the ejection orifices 6 through the flow path member 7.

In each of the steps from the formation of the first protective layer 1 to the formation of the laminate structure including the mold 12 and the flow path member 7, peeling regions 11, in which the first protective layer 1 partially lacks to expose the substrate 4, are sometimes generated. As the reason of generation of the peeling regions 11, particles which adhere during the formation of the first protective layer 1, a physical damage generated during the delivery of the substrate 4 after the formation of the first protective layer 1, and the like are given. If the peeling regions 11 are present, the substrate 4 which is exposed through the peeling regions 11 comes into contact with the alkaline etchant to develop the etching of the substrate 4 when the supply port 5 is formed with the alkaline etchant in a later step. Therefore, the substrate 4 is unexpectedly processed from the exposed portions thereof in the peeling regions 11. As a result, a volume of the substrate 4 is reduced to lower the rigidity of the substrate 4. Further, the processed portions of the substrate 4, which are formed through the peeling regions 11, and the supply port may be combined to increase a volume of the supply port. In this case, an area in which the liquid ejection unit adheres is reduced to lower an adhesive force.

In order to solve the problem described above, the second protective layers 2 are formed on the one surface of the substrate 4 so as to cover at least the peeling regions 11 of the first protective layer 1 as illustrated in FIGS. 2F-1 and 2F-2 in this embodiment. It is preferred to form the second protective layers 2 by electroless plating. The electroless plating is a technique which uses electrons generated when a reducing agent contained in the plating solution is oxidized to deposit a metal. The electroless plating enables the selective formation of a metal film by the combination of an underlayer material and the metal to be deposited. When gold is used as a metal to be deposited in this embodiment, the second protective layers 2 are formed in the peeling regions 11 of the first protective layer 1 so as to cover the peeling regions 11. On the other hand, the second protective layers 2 are not formed on the first protective layer 1 other than the peeling regions 11. Besides gold, metals such as nickel and copper can be used in the electroless plating. The above-mentioned metals may be used solely or at least two thereof may be used in combination. Although the formation of the second protective layers 2 and the formation of the electrode pads 3 are performed in the different steps in this embodiment, the second protective layers 2 and the electrode pads 3 may be formed in the same step as described in a subsequent embodiment. In this case, the electrode pads 3 and the second protective layers 2 can be formed by the electroless plating in the same step. As the second protective layers 2, at least one metal layer may be formed by the electroless plating.

Next, as illustrated in FIGS. 2G-1 and 2G-2, after at least one of a part of the first protective layer 1 and a part of the second protective layers 2 is removed, the supply port 5 leading from the one surface of the substrate 4 to the another surface thereof is formed. First, a resist (not shown) is applied thereon by spin coating so as to cover the flow path member 7 and the electrode pads 3. It is preferred that the resist be made of a material which has alkali resistance and is easily removable by a wet treatment. As the resist, for example, a cyclorubber can be used. Next, laser holes which pass through at least one of the first protective layer 1 and the second protective layers 2 and terminate in the substrate 4 are formed by using laser abrasion. Around regions in which the laser holes are formed, a laser pattern which passes through at least one of the first protective layer 1 and the second protective layer 2 is formed by the laser abrasion. The region in which the laser holes and the laser pattern are processed is a region in which silicon corresponding to a constituent material of the substrate 4 is exposed. Therefore, when the substrate 4 is dipped into the alkaline etchant after the processes with the laser abrasion, anisotropic etching develops from silicon exposed through the laser holes and the laser pattern. As a result, the supply port 5 having a shape including a silicon (111) surface is formed. In the present invention, at least one of the first protective layer 1 and the second protective layers 2 may be partially removed to expose the substrate 4 by photolithography and etching in place of the laser abrasion.

Next, a dry etching treatment is performed in a gas atmosphere containing $CF_4$, $O_2$, and $N_2$ to remove the insulating layer 22 covering the upper part of the supply port 5. Thereafter, the resist provided in the above-mentioned step is removed by the wet treatment. Subsequently, the mold 12 is removed by UV radiation and the wet treatment to form the flow path 9. By the steps described above, the liquid ejection head illustrated in FIGS. 2H-1 and 2H-2 is completed.

In the liquid ejection head manufactured by the method according to the first embodiment, neither the generation of a void other than the supply port 5 in the substrate 4 nor the enlargement of the shape of the supply port 5 due to the lack of each of the protective layers occurs owing to the presence of the first protective layer 1 and the second protective layers 2. As a result, the rigidity of the substrate 4 can be ensured, while the adhesion to the external unit can be kept. Therefore, the liquid ejection head having stable quality can be supplied.

Second Embodiment

In the following, a method of manufacturing a liquid ejection head according to a second embodiment of the present invention is described referring to FIGS. 3A-1 to 3G-2. FIGS. 3A-1 to 3G-2 are sectional views of the liquid ejection head illustrated in FIG. 1A, taken along the line A-A and the line B-B, and illustrate respective steps. FIGS. 3A-1, 3B-1 and so forth are sectional views taken along the line A-A, whereas FIGS. 3A-2, 3B-2 and so forth are sectional views taken along the line B-B.

First, as illustrated in FIGS. 3A-1 and 3A-2, the substrate 4 having silicon (100) surfaces is prepared in the same manner as in the first embodiment. The first protective layer 1 is formed on one of the (100) surfaces, whereas the insulating layer 21 is formed on another of the (100) surfaces of the substrate 4.

Next, as illustrated in FIGS. 3B-1 and 3B-2, a structure in which the insulating layer 21 is partially removed is formed in the same manner as in the first embodiment.

Next, as illustrated in FIGS. 3C-1 and 3C-2, a laminate structure including the energy generating elements 8, the wiring layers 10, and the insulating layer 22 is formed on the insulating layer 21, in the same manner as in the first embodiment.

Next, as illustrated in FIGS. 3D-1 and 3D-2, a laminate structure including the mold 12 and the flow path member 7 is formed on the uppermost layer containing the insulating layer 22, in the same manner as in the first embodiment.

Next, as illustrated in FIGS. 3E-1 and 3E-2, the electrode pads 3 are formed on the exposed portions of the wiring layers 10, while the second protective layers 2 are formed on the one surface of the substrate 4 so as to cover at least the peeling regions 11 of the first protective layer 1. In this embodiment, after the formation of the laminate structure including the mold 12 and the flow path member 7, the electrode pads 3 and the second protective layers 2 are formed in the same step. The electrode pads 3 and the second protective layers 2 can be formed by electroless plating as in the case of the first embodiment. In the case where gold is used as a metal to be deposited in the second embodiment, the second protective layers 2 are formed in the peeling regions 11 of the first protective layer 1 so as to cover the peeling regions 11. On the other hand, the second protective layers 2 are not formed on the first protective layer 1 other than the peeling regions 11. In the regions in which the wiring layers 10 are exposed, gold starts growing from the wiring layers 10 to form the electrode pads 3 so as to cover the wiring layers 10 and the insulating layer 22 which is present around the wiring layers 10. On the other hand, the growth of gold starting from the insulating layer 22 does not occur. As a material of the second protective layers 2 and the electrode pads 3, not only gold but also nickel and copper can be used. The above-mentioned materials may be used solely or at least two thereof may be used in combination.

Next, as illustrated in FIGS. 3F-1 and 3F-2, after at least one of a part of the first protective layer 1 and a part of the second protective layers 2 is removed in the same manner as in the first embodiment, the supply port 5 leading from the one surface of the substrate 4 to the another surface thereof is formed.

Thereafter, in the same manner as in the first embodiment, the liquid ejection head illustrated in FIGS. 3G-1 and 3G-2 is completed.

In the liquid ejection head manufactured by the method according to the second embodiment, neither the generation of a void other than the supply port 5 in the substrate 4 nor the enlargement of the shape of the supply port 5 due to the lack of each of the protective layers occurs owing to the presence of the first protective layer 1 and the second protective layers 2. As a result, the rigidity of the substrate 4 can be ensured, while the adhesion to the external unit can be kept. Therefore, the liquid ejection head having stable quality can be supplied. Moreover, the second protective layers 2 and the electrode pads 3 are formed simultaneously. Therefore, the liquid ejection head can be manufactured by a simple method.

Third Embodiment

In the following, a method of manufacturing a liquid ejection head according to a third embodiment of the present invention is described referring to FIGS. 4A-1 to 4F-2. FIGS. 4A-1 to 4F-2 are sectional views of the liquid ejection head illustrated in FIG. 1A, taken along the line A-A and the line B-B, and illustrate respective steps. FIGS. 4A-1, 4B-1 and so forth are sectional views taken along the line A-A, whereas FIGS. 4A-2, 4B-2 and so forth are sectional views taken along the line B-B.

First, as illustrated in FIGS. 4A-1 and 4A-2, the substrate 4 having silicon (100) surfaces is prepared. The first protective layer 1 containing nickel is formed by vapor deposition on one of the (100) surfaces. Further, in the same manner as in the first embodiment, the insulating layer 21 is formed on another of the (100) surfaces of the substrate 4.

Next, as illustrated in FIGS. 4B-1 and 4B-2, a laminate structure including the energy generating elements 8, the wiring layers 10, and the insulating layer 22 is formed on the insulating layer 21, in the same manner as in the first embodiment.

Next, as illustrated in FIGS. 4C-1 and 4C-2, a laminate structure including the mold 12 and the flow path member 7 is formed on the uppermost layer containing the insulating layer 22, in the same manner as in the first embodiment.

Next, as illustrated in FIGS. 4D-1 and 4D-2, the electrode pads 3 are formed on the exposed portions of the wiring layers 10, while the second protective layers 2 are formed on the one surface of the substrate 4 so as to cover at least the peeling regions 11 of the first protective layer 1. In this embodiment, after the formation of the laminate structure including the mold 12 and the flow path member 7, the electrode pads 3 and the second protective layers 2 are formed in the same step. The electrode pads 3 and the second protective layers 2 can be formed by electroless plating as in the case of the first embodiment. In the case where gold is used as a metal to be deposited in the third embodiment, the second protective layers 2 are formed in the peeling regions 11 of the first protective layer 1 so as to cover the peeling regions 11. At the same time, the second protective layers 2 are also formed on the first protective layer 1 other than the peeling regions 11. In the regions in which the wiring layers 10 are exposed, gold starts growing from the wiring layers 10 to form the electrode pads 3 so as to cover the wiring layers 10 and the insulating layer 22 which is present around the wiring layers 10. On the other hand, the growth of gold starting from the insulating layer 22 does not occur. As a material of the second protective layers 2 and the electrode pads 3, the same materials as those of the second embodiment can be used.

Next, as illustrated in FIGS. 4E-1 and 4E-2, after at least one of a part of the first protective layer 1 and a part of the second protective layers 2 is removed in the same manner as in the first embodiment, the supply port 5 leading from the one surface of the substrate 4 to the another surface thereof is formed.

Thereafter, in the same manner as in the first embodiment, the liquid ejection head illustrated in FIGS. 4F-1 and 4F-2 is completed.

In the liquid ejection head manufactured by the method according to the third embodiment, neither the generation of a void other than the supply port 5 in the substrate 4 nor the enlargement of the shape of the supply port 5 due to the lack of each of the protective layers occurs owing to the presence of the first protective layer 1 and the second protective layers 2. As a result, the rigidity of the substrate 4 can be ensured, while the adhesion to the external unit can be kept. Therefore, the liquid ejection head having stable quality can be supplied. Moreover, the second protective layers 2 and the electrode pads 3 are formed simultaneously. Therefore, the liquid ejection head can be manufactured by a simple method.

EXAMPLES

Example 1

In the following, a method of manufacturing the liquid ejection head of Example 1 is described referring to FIGS. 2A-1 to 2H-2.

First, as illustrated in FIGS. 2A-1 and 2A-2, the substrate 4 having the silicon (100) surfaces was prepared. The silicon oxide film was formed as the first protective layer 1 on one of the (100) surfaces of the substrate 4 by thermal oxidation. The silicon oxide film was formed as the insulating layer 21 on another (100) surface of the substrate 4 by thermal oxidation.

Next, as illustrated in FIGS. 2B-1 and 2B-2, the structure in which the insulating layer 21 was partially removed was formed. First, the positive resist containing an organic resin (trade name: IP5700, manufactured by TOKYO OHKA KOGYO CO., LTD.) was applied onto the insulating layer 21 by spin coating. Then, exposure and development were carried out to partially remove the resist present in the exposed portions. Thereafter, the insulating layer 21 was selectively removed by dry etching to form the structure described above.

Next, as illustrated in FIGS. 2C-1 and 2C-2, the laminate structure including the energy generating elements 8, the wiring layers 10, and the insulating layer 22 was formed on the insulating layer 21. First, the tantalum-silicon alloy target was prepared. The tantalum silicon nitride film, which was used to form the energy generating elements 8, was formed on the uppermost layer containing the insulating layer 21 by sputtering. Subsequently, the aluminum target was prepared. The aluminum film, which was used to form the wiring layers 10, was successively formed on the tantalum silicon nitride film by sputtering. Next, the positive resist made of the organic resin (trade name: IP5700, manufactured by TOKYO OHKA KOGYO CO., LTD.) was applied onto the insulating layer 21 by spin coating. The exposure and development were carried out to partially remove the resist present in the exposed portions. Thereafter, the tantalum silicon nitride film and the aluminum film were selectively etched by using dry etching. Thereafter, the resist was removed. Next, the insulating layer 22 mainly made of silicon nitride was formed on the energy generating elements 8 and the wiring layers 10 by chemical vapor deposition. Further, after the positive resist made of the organic resin (trade name: IP5700, manufactured by TOKYO OHKA KOGYO CO., LTD.) was applied onto the insulating layer 22 by spin coating, the exposure and development were carried out to partially remove the resist present in the exposed portions. Thereafter, the insulating layer 22 was selectively removed by dry etching. As a result, as illustrated in FIG. 2C-2, the structure in which the insulating layer 22 was partially removed to partially expose the wiring layers 10 was provided.

Next, as illustrated in FIGS. 2D-1 and 2D-2, the electrode pads 3 were formed on the exposed portions of the wiring layers 10. First, the titanium-tungsten layer and the gold layer were formed by sputtering. Then, the positive resist made of the organic resin (trade name: IP5700, manufactured by TOKYO OHKA KOGYO CO., LTD.) was applied thereon by spin coating. After the resist was selectively removed by using photolithography to expose the gold layer, the electroplating treatment was performed in the plating solution containing gold. Thereafter, the resist, the gold layer, and the titanium-tungsten layer were removed to form the electrode pads 3.

Next, as illustrated in FIGS. 2E-1 and 2E-2, the laminate structure including the mold 12 and the flow path member 7 was formed on the uppermost layer containing the insulating layer 22 on the another surface of the substrate 4. First, the positive photosensitive resin material (trade name: ODUR, manufactured by TOKYO OHKA KOGYO CO., LTD.) was applied thereon by spin coating. The exposure and development were carried out to form the mold 12 having a thickness of 14 μm. Next, the negative photosensitive resin material (trade name: EHPE-3150, manufactured by DAICEL Corporation) was applied thereon by spin coating. Then, the exposure and development were carried out to form the flow path member 7 having a thickness of 25 μm on the mold 12. Subsequently, the flow path member 7 was exposed and developed by using photolithography to form the ejection orifices 6 provided through the flow path member 7.

Next, as illustrated in FIGS. 2F-1 and 2F-2, the second protective layers 2 were formed on the one surface of the substrate 4 by electroless plating using gold as a metal to be deposited so as to cover at least the peeling regions 11 of the first protective layer 1. The second protective layers 2 were formed in the peeling regions 11 of the first protective layer 1 so as to cover the peeling regions 11. On the other hand, on the first protective layer 1 other than the peeling regions 11, the second protective layer 2 was not formed.

Next, as illustrated in FIGS. 2G-1 and 2G-2, after at least one of the part of the first protective layer 1 and the part of the second protective layers 2 was removed, the supply port 5 leading from the one surface of the substrate 4 to the another surface of the substrate 4 was formed. First, the resist (not shown) made of the cyclorubber was applied thereon by spin coating to cover the flow path member 7 and the electrode pads 3. Next, the laser holes which passed through at least one of the first protective layer 1 and the second protective layers 2 and terminated in the substrate 4 were formed. Around the regions where the laser holes were formed, the laser pattern which passed through at least one of the first protective layer 1 and the second protective layers 2 was formed by the laser abrasion. Thereafter, the substrate 4 was dipped into the alkaline etchant to develop the anisotropic etching from silicon exposed through the laser holes and the laser pattern. In this manner, the supply port 5 having the shape with the silicon (111) surface was formed.

Next, the dry etching treatment was performed in the gas atmosphere containing $CF_4$, $O_2$, and $N_2$ so as to remove the insulating layer 22 covering the upper part of the supply port 5. Thereafter, the resist which was provided in the above-mentioned step was removed by the wet treatment. Subsequently, the mold 12 was removed by UV radiation and the wet treatment to form the flow path 9. By the method described above, the liquid ejection head illustrated in FIGS. 2H-1 and 2H-2 was completed.

In the liquid ejection head manufactured by the method described in Example 1, neither the generation of a void other than the supply port 5 in the substrate 4 nor the enlargement of the shape of the supply port 5 due to the lack of each of the protective layers occurred, owing to the presence of the first protective layer 1 and the second protective layers 2. As a result, the rigidity of the substrate 4 was ensured, while the adhesion to the external unit was successfully maintained. Therefore, the liquid ejection head having stable quality was successfully supplied.

Example 2

In the following, a method of manufacturing the liquid ejection head of Example 2 is described referring to FIGS. 3A-1 to 3G-2.

First, as illustrated in FIGS. 3A-1 and 3A-2, the substrate 4 having the silicon (100) surfaces was prepared in the same manner as in Example 1. The first protective layer 1 was formed on one of the (100) surfaces of the substrate 4 and the insulating layer 21 was formed on another (100) surface of the substrate 4.

Next, as illustrated in FIGS. 3B-1 and 3B-2, the structure in which the insulating layer 21 was partially removed was formed in the same manner as in Example 1.

Next, as illustrated in FIGS. 3C-1 and 3C-2, the laminate structure including the energy generating elements 8, the wiring layers 10, and the insulating layer 22 was formed on the insulating layer 21, in the same manner as in Example 1.

Next, as illustrated in FIGS. 3D-1 and 3D-2, the laminate structure including the mold 12 and the flow path member 7 was formed on the uppermost layer containing the insulating layer 22 in the same manner as in Example 1.

Next, as illustrated in FIGS. 3E-1 and 3E-2, the electrode pads 3 were formed on the exposed portions of the wiring layers 10 by electroless plating using gold as a metal to be deposited, while the second protective layers 2 were formed on the one surface of the substrate 4 so as to cover at least the peeling regions 11 of the first protective layer 1. At this time, the second protective layers 2 were formed in the peeling regions of the first protective layer 1 so as to cover the peeling regions 11. On the other hand, the second protective layers 2 were not formed on the first protective layer 1 other than the peeling regions 11. In the regions where the wiring layers 10 were exposed, gold started growing from the wiring layers 10. As a result, the electrode pads 3 were formed so as to cover the wiring layers 10 and the insulating layer 22 present around the wiring layers 10. On the other hand, the growth of gold starting from the insulating layer 22 did not occur.

Next, as illustrated in FIGS. 3F-1 and 3F-2, after at least one of the part of the first protective layer 1 and the part of the second protective layers 2 was removed in the same manner as in Example 1, the supply port 5 leading from the one surface of the substrate 4 to the another surface of the substrate 4 was formed.

Thereafter, in the same manner as in Example 1, the liquid ejection head illustrated in FIGS. 3G-1 and 3G-2 was completed.

In the liquid ejection head manufactured by the method described in Example 2, neither the generation of a void other than the supply port 5 in the substrate 4 nor the enlargement of the shape of the supply port 5 due to the lack of each of the protective layers occurred, owing to the presence of the first protective layer 1 and the second protective layers 2. As a result, the rigidity of the substrate 4 was ensured, while the adhesion to the external unit was successfully maintained. Therefore, the liquid ejection head having stable quality was successfully supplied. Moreover, the second protective layers 2 and the electrode pads 3 were formed simultaneously. Therefore, the liquid ejection head was successfully manufactured by a simple method.

Example 3

The liquid ejection head was completed in the same manner as in Example 2 with the exception that the first protective layer 1 containing nickel was formed by vapor deposition in the formation of the first protective layer 1. In the formation of the electrode pads 3 and the second protective layers 2, simultaneously with the formation of the second protective layers 2 so as to cover the peeling regions 11 of the first protective layer 1, the second protective layers 2 were similarly formed even on the first protective layer other than the peeling regions 11.

In the liquid ejection head manufactured by the method described in Example 3, neither the generation of a void other than the supply port 5 in the substrate 4 nor the enlargement of the shape of the supply port 5 due to the lack of each of the protective layers occurred, owing to the presence of the first protective layer 1 and the second protective layers 2. As a result, the rigidity of the substrate 4 was ensured, while the adhesion to the external unit was successfully maintained. Therefore, the liquid ejection head having stable quality was successfully supplied. Moreover, the second protective layers 2 and the electrode pads 3 were formed simultaneously. Therefore, the liquid ejection head was successfully manufactured by a simple method.

According to the method of the present invention, the etching processed shape in the formation of the supply port can be stabilized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103159, filed Apr. 27, 2012, which is hereby incorporated by reference herein in its entirety.

What is claimed is:

1. A method of manufacturing a liquid ejection head, the liquid ejection head comprising:
   a substrate;

a protective layer formed on one surface of the substrate;
a wiring layer formed on another surface of the substrate;
an insulating layer and an electrode pad provided on the wiring layer; and
a supply port provided so as to bring the one surface of the substrate and the another surface of the substrate into communication with each other,
the method comprising:
(1) forming a first protective layer on the one surface of the substrate;
(2) forming the wiring layer on the another surface of the substrate;
(3) forming the insulating layer on the wiring layer, and then partially removing the insulating layer to partially expose the wiring layer;
(4) forming the electrode pad on an exposed portion of the wiring layer;
(5) forming a flow path member on the another surface of the substrate;
(6) forming a second protective layer on the one surface of the substrate after the formation of the flow path member; and
(7) partially removing at least one of the first protective layer and the second protective layer, and then forming the supply port leading from the one surface of the substrate to the another surface of the substrate,
wherein the formation of the electrode pad is performed as the same step as the formation of the second protective layer after the formation of the flow path member.

2. The method of manufacturing a liquid ejection head according to claim 1, wherein the formation of the second protective layer comprises forming at least one metal layer by electroless plating.

3. The method of manufacturing a liquid ejection head according to claim 1, wherein the formation of the first protective layer comprises forming one of at least one insulating layer and at least one metal layer by vacuum deposition.

4. The method of manufacturing a liquid ejection head according to claim 1, wherein the formation of the electrode pad and the formation of the second protective layer are performed by electroless plating.

5. The method of manufacturing a liquid ejection head according to claim 1, wherein the second protective layer comprises at least one of nickel and gold.

6. The method of manufacturing a liquid ejection head according to claim 1, wherein the first protective layer comprises at least one selected from the group consisting of silicon oxide, silicon nitride, nickel, and gold.

7. The method of manufacturing a liquid ejection head according to claim 1, wherein the second protective layer is formed to cover at least a peeling region of the first protective layer, the peeling region being generated between the formation of the first protective layer and the formation of the flow path member.

8. The method of manufacturing a liquid ejection head according to claim 1, wherein the partial removal of at least one of the first protective layer and the second protective layer is performed by laser abrasion.

9. The method of manufacturing a liquid ejection head according to claim 1, wherein the partial removal of at least one of the first protective layer and the second protective layer is performed by one of photolithography and etching.

* * * * *